(12) United States Patent
Hadley et al.

(10) Patent No.: US 6,590,346 B1
(45) Date of Patent: Jul. 8, 2003

(54) DOUBLE-METAL BACKGROUND DRIVEN DISPLAYS

(75) Inventors: Mark Alfred Hadley, Newark, CA (US); Randolph Wilfred Eisenhardt, Prunedale, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 09/906,627

(22) Filed: Jul. 16, 2001

(51) Int. Cl.[7] ................................................. G09G 3/10
(52) U.S. Cl. ........................ 315/169.3; 315/169.1; 438/22; 438/106; 313/511; 313/521
(58) Field of Search .......................... 315/169.3, 169.1; 438/22–24, 27–30, 98, 106, 758, 761, 928, 971, 974; 349/45, 52, 69; 428/209; 313/506, 509, 511, 521; 257/693, 698, 701, 686

(56) References Cited

U.S. PATENT DOCUMENTS

| | | | | |
|---|---|---|---|---|
| 5,545,291 A | * | 8/1996 | Smith et al. | 438/107 |
| 5,754,266 A | * | 5/1998 | Ohta et al. | 349/110 |
| 6,274,508 B1 | * | 8/2001 | Jacobsen et al. | 156/324 |
| 6,281,038 B1 | * | 8/2001 | Jacobsen et al. | 438/106 |
| 6,291,896 B1 | * | 9/2001 | Smith | 257/693 |
| 6,316,278 B1 | * | 11/2001 | Jacobsen et al. | 438/106 |

OTHER PUBLICATIONS

Yeh and Smith, "Fluidic Self–Assembly of GaAs Microstructures on Si Substrates", Sensors and Materials, vol. 6, No. 6 (1994), MYU Tokyo, pp. 1–14.

* cited by examiner

*Primary Examiner*—Haissa Philogene
(74) *Attorney, Agent, or Firm*—Blakely, Sokoloff, Taylor & Zafman LLP (57) ABSTRACT

Method and apparatus for electrical devices. An electronic assembly comprises at least one object having a first electrical circuitry therein. The object is created and separated from a host substrate. The assembly further comprises a receiving substrate having at least one recess. A bottom conducting layer is deposited over the receiving substrate and the recess. The object is then coupled to the receiving substrate such that the object is deposited on the bottom conducting layer and recessed within the first recess and below a surface of the receiving substrate. An insulation layer having a plurality of vias is disposed over the receiving substrate to insulate the bottom conducting layer and the object. A top conducting is deposited over the insulation layer and is making electrical interconnections to the bottom conducting layer and the object through the vias.

50 Claims, 6 Drawing Sheets

DOUBLE-METAL BACKGROUND DRIVEN DISPLAYS

FIELD OF THE INVENTION

The present invention relates generally to the field of fabricating modular assemblies. More particularly, the present invention relates to methods and apparatuses for forming electrical devices having a double-metal driven component.

BACKGROUND OF THE INVENTION

Fabrication of display panels is well known in the art. Display panels may be comprised of active matrix or passive matrix panels. Active matrix panels and passive matrix panels may be either transmissive or reflective. Transmissive displays include polysilicon thin-film transistor (TFT) displays, and high-resolution polysilicon displays. Reflective displays typically comprise single crystal silicon integrated circuit substrates that have reflective pixels.

Liquid crystals, electroluminescent (EL) materials, organic light emitting diodes (OLEDs) up and downconverting phosphor (U/DCP), electrophoretic (EP) materials, or light emitting diodes (LEDs) may be used in fabricating flat-panel display panels. Each of these is known in the art and is discussed briefly below.

Liquid crystal displays uses rod-shaped molecules (liquid crystals) that flow like liquid and have the ability to bend light. The liquid crystals are typically sandwiched between two polarizing filters, horizontal and vertical. Unenergized, the crystals direct light through these two polarizing filters, allowing a natural background color to show. When energized, the crystals redirect the light to be absorbed in one of the polarizing filers, causing the dark appearance of the crossed polarizing filter to show.

Liquid crystal displays (LCDs) can be passive or active. In a passive matrix display, all of the active electronics (e.g., transistors) are outside of the display screen. LCDs may also have a passive matrix backplane which is usually two planes of strip electrodes which sandwich the liquid crystal material. However, passive matrices generally provide a lower quality display compared to active matrices. Liquid crystal materials includes, but is not limited to, twisted nematic (TN), Super TN, double STN, and ferroelectric.

In an active matrix display, the active electronics are built into each pixel within the screen. For instance, the thin-film transistors are co-located with the LCD pixels in the backplane. In particular, flat-panel displays employing LCDs generally include five different components or layers: a White or sequential Red, Green, Blue light source, a first polarizing filter, that is mounted to one side of a circuit panel on which the TFTs are arrayed to form pixels, a filter plate containing at least three primary colors arranged into pixels, and a second polarizing filter. A volume between the circuit panel and the filter plate is filled with a liquid crystal material. This material will rotate the polarized light when an electric field is applied between the circuit panel and a transparent ground electrode affixed to the filter plate or a cover glass. Thus, when a particular pixel of the display is turned on, the liquid crystal material rotates polarized light being transmitted through the material so that it will pass through the second polarizing filter. Some liquid crystal material, however, require no polarizers.

U/DCP and EP displays are formed in a similar fashion except the active medium is different (e.g., upconverting gas, downconverting gas, electrophoretic materials).

EL displays have one or more pixels that are energized by an alternating current (AC) that must be provided to each pixel by row and column interconnects. EL displays generally provide a low brightness output because passive circuitry for exciting pixel phosphors typically operates at a pixel excitation frequency that is low relative to the luminance decay time of the phospor material. However, an active matrix reduces the interconnect capacitance allowing the use of high frequency AC in order to obtain more efficient electroluminescence in the pixel phosphor. This results in increased brightness in the display.

LED displays are also used in flat-panel displays. LEDs emit light when energized. OLEDs operate like the LEDs except OLEDs use organic material in the formation of the diode.

Regardless of the type of active medium used, displays are generally comprised of at least a substrate and a backplane. The backplane forms the electrical interconnection of the display and comprises electrodes, capacitors, and transistors in at least some embodiments of a backplane.

In one typical example, the backplane may be formed by depositing blocks, using an FSA technique, into a substrate (e.g. glass); each block contains a driving circuit for driving a particular segment of the display by driving certain pixel electrodes in the display. An example of an FSA technique is described in U.S. Pat. No. 5,545,291. The pixel electrodes then control the display. For example, a capacitor is coupled to a pixel electrode by another conductor that is deposited onto the substrate. The active medium (e.g., a liquid crystal) is deposited at least on the pixel electrodes which will optically change the active medium's properties in response to the combined voltages or currents produced by the pixel electrodes.

For each segment of the display, some pixel electrodes are dedicated to driving the images that we see on the display (e.g., numerical values or alphabetical values) and some pixel electrodes are dedicated to driving the background associated with that particular segment. There are, of course, multiple segments that control the images on the display and thus, there are also multiple pixel electrodes that drive the background of those images. However, all of the pixel electrodes that drive the background typically have the same function, i.e., to drive the background. Yet, there are multiple pixel electrodes dedicated to do the same function. The multiplicity of the pixel electrodes requires multiplicity of driving circuits or functional blocks. The multiplicity of the driving circuits or functional blocks then makes the fabrication of the display complex because more blocks and interconnections are needed.

SUMMARY OF THE INVENTION

The present invention relates to making electrical devices that require less functional blocks and less complicated interconnections especially when there are multiple segments or portions of the electrical devices that could be uniformly controlled. An electronic assembly comprises at least one object, a receiving substrate, such as a flexible receiving substrate, a bottom conducting layer, a top conducting layer, an insulation layer and electrical interconnections. The object having a first electrical circuitry therein is created and separated from a host substrate. The flexible receiving substrate has at least one recess. The bottom conducting layer is deposited over the flexible receiving substrate and the recess. The object is coupled to the receiving substrate such that the object is deposited on the bottom conducting layer and recessed within the first recess and below a surface of the receiving substrate. The insulation layer is disposed over the receiving substrate such that the insulation layer insulates the bottom conducting layer and the first object. The insulation layer includes a plurality of vias through which electrical interconnections are established. The top conducting layer is deposited over the insulation layer and is making the electrical interconnections to the bottom conducting layer and the first object through those vias.

BRIEF DESCRIPTION OF THE DRAWINGS

The present invention is illustrated by way of example and not limitation in the figures of the accompanying drawings, in which like references indicate similar elements and in which.

DETAILED DESCRIPTION OF THE INVENTION

In the following description, for purposes of explanation, numerous specific details are set forth in order to provide a thorough understanding of the present invention. It will also be appreciated that although the following examples relate to a making of a display, the present invention can be applied to a wide area of electronic devices without deviation from the merit of the invention. The following description and drawings are illustrative of the invention and are not to be construed as limiting the invention.

Figure 1A:
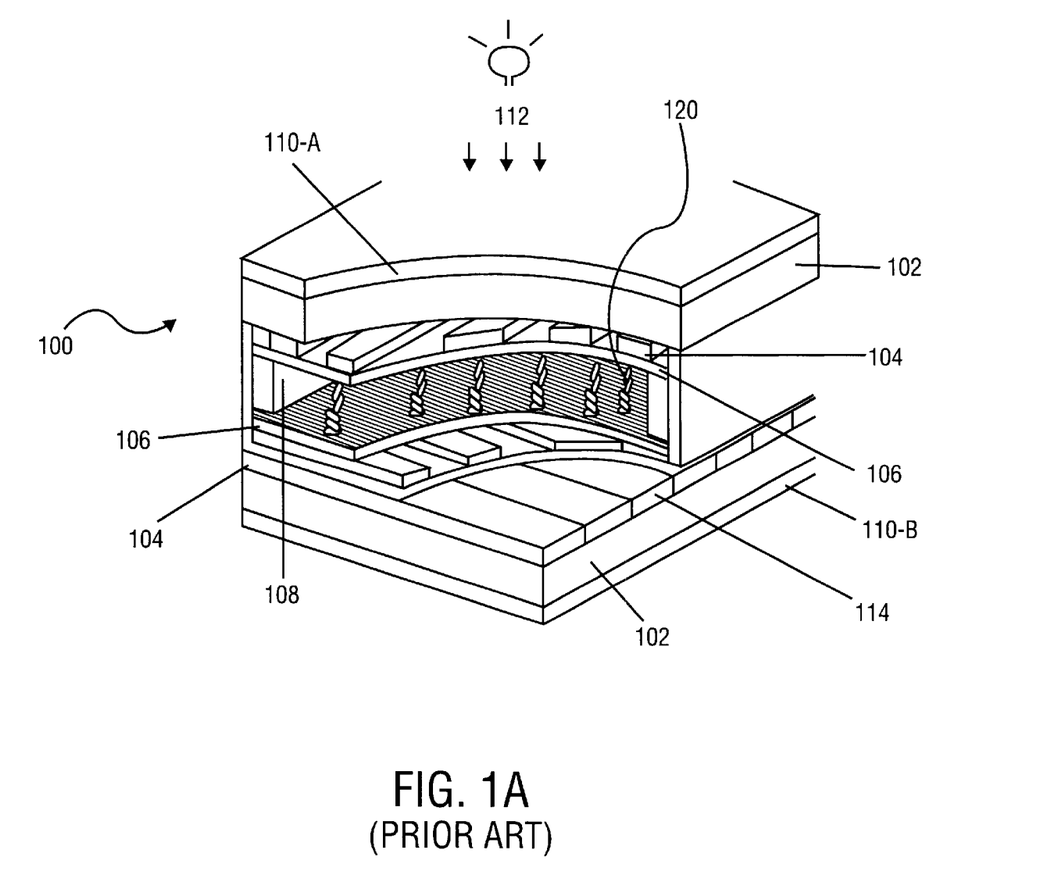
FIGS. 1A–1D illustrate exemplary embodiments of prior art displays.

A conventional normal passive matrix LCD 100 comprises a number of layers which form a display panel. (FIG. 1A). The first is a sheet of glass 102 coated with a metal oxide layer 104. The metal oxide material used is a highly transparent material so as to not interfere with the quality of the image's integrity. This operates as a grid of row and column of pixel electrodes, which passes the current needed to activate the screen elements and control the pixels on the display screen. On top of this, a polymer material is applied that has a series of parallel grooves running across it to align the liquid crystal molecules in the appropriate direction, and to provide a base on which the molecules are attached. This is known as the alignment layer 106 and is repeated on another glass plate 102 that also carries a number of spacer beads 108, which maintain a uniform distance between the two sheets of glass when they are placed together.

The edges are then sealed with an epoxy, but with a gap left in one corner. This allows liquid-crystal material 120 to be injected between the sheets (in a vacuum) before the plates are sealed completely. Next, polarizing layers 110A and 110B, which are filters, are applied to the outer-most surfaces of each glass sheet 102 to match the orientation of the alignment layers 106. A backlight 112 can also be added, typically in the form of cold-cathode fluorescent tubes mounted along the top and bottom edges of the panel, the light from these being distributed across the panel using a plastic light guide or prism.

Figure 1B:
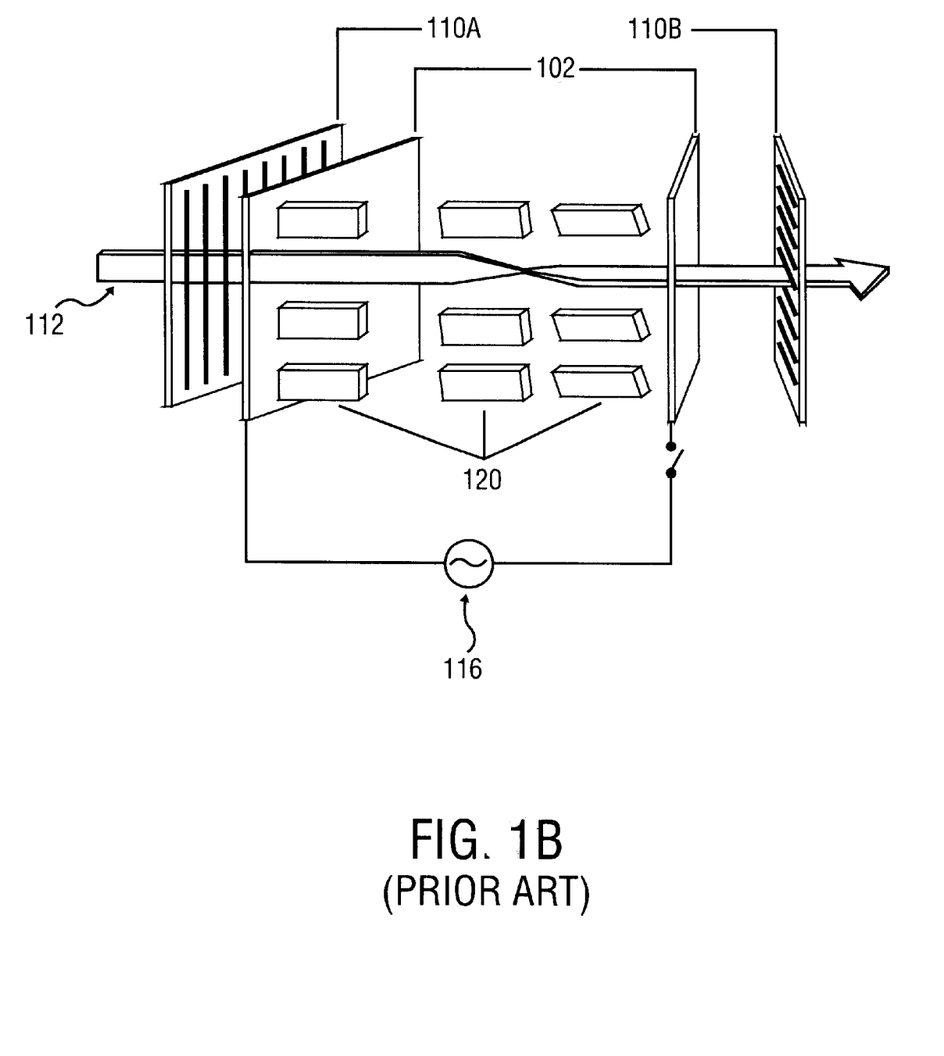

The image which appears on the display screen is created by this light as it passes through the layers of the display panel. With no power applied across the LCD panel, light from the backlight is vertically polarized by the rear filter 110A and refracted by the molecular chains in the liquid crystal so that it emerges from the horizontally polarized filter 110B at the front. Applying a voltage 116 realigns the liquid crystals 120 so that light cannot pass, producing dark pixels (FIG. 1B). The segments in the display where the pixels are dark can be called the background segments of the display. The color image segments, for instance, pictures or an alphanumerical images, are produced by simply using additional red, green and blue colored filters 114 over three separate LCD elements to create a single multi-colored pixel.

An active matrix display adopted Thin Film Transistor (TFT) technology to improve color screens, contrast, and sharpness of the images on the display. In an active matrix display, an extra matrix of transistors (not shown) is connected to the LCD panel—one transistor for each color red blue green of each pixel. These transistors drive the pixels, eliminating the problems of ghosting and slow response speed that afflict LCDs such as the passive matrix display. In an active matrix display, when a voltage is applied across the liquid crystal elements, they twist by up to ninety degrees in proportion to the voltage thereby changing their polarization and letting more light through. The transistors control the degree of twist and hence the intensity of the red, green and blue elements of each pixel forming the image on the display.

Figure 1C:
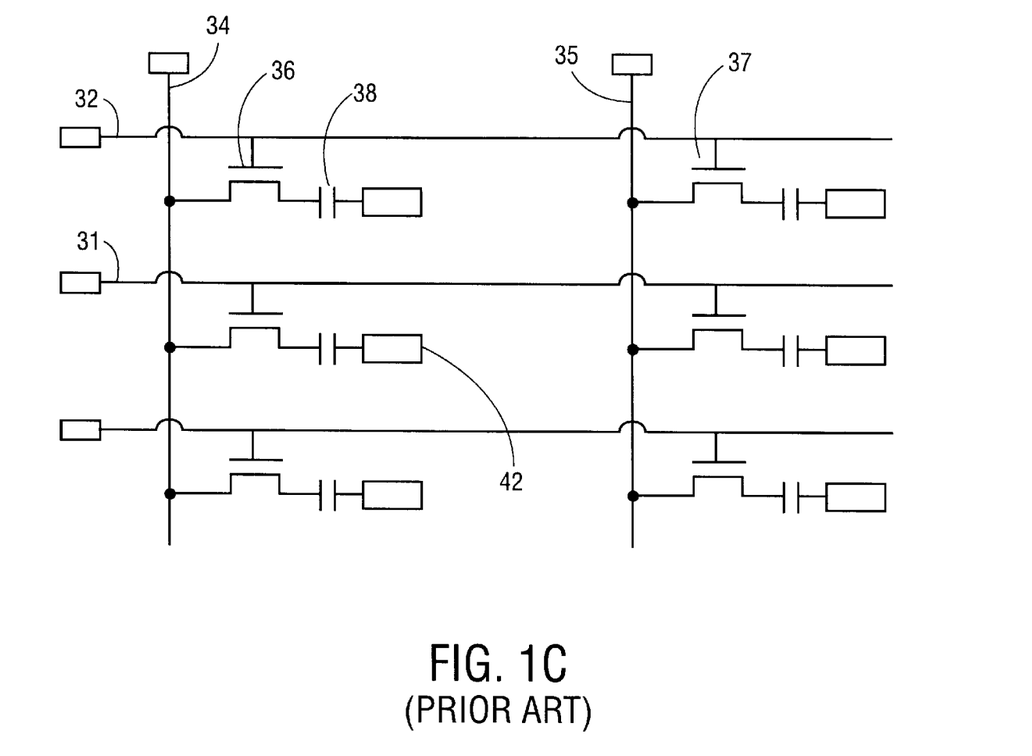
Figure 1D:
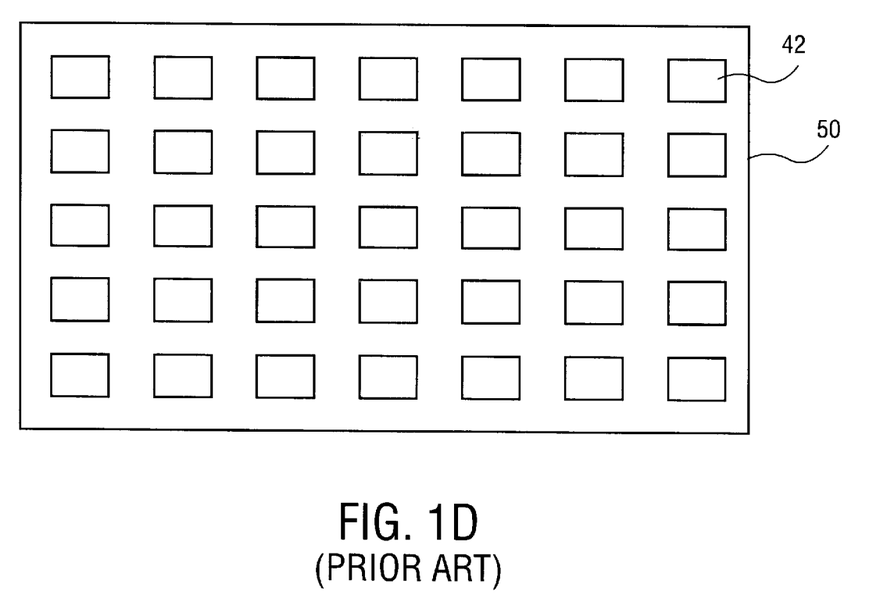

FIG. 1C shows a portion of an array in a conventional active matrix display backplane. The control line rows 31 and 32 in this device are coupled to gate electrodes along a row and the control line columns 34 and 35 are coupled to data drivers which supply pixel voltages which are applied to the pixel electrodes. A column line 34 is connected to a source electrode of field effect transistor (FET) 36. Another column line 35 is coupled to a source electrode of FET 37. A row line 32 is coupled to the gates of both FETs 36 and 37. The drain of FET 36 is coupled through capacitor 38 to a transparent pixel electrode along the row 32 formed by FETs 36 and 37, and the drain of FET 37 is coupled through a capacitor to another pixel electrode along the row. In one typical example, the backplane may be formed by depositing blocks, using an FSA technique, into a substrate (e.g. glass); each block contains a FET and a capacitor and is interconnected to other blocks by column and row conductors that are deposited onto the substrate; and, the capacitor is coupled to a pixel electrode by another conductor that is deposited onto the substrate. The active medium (e.g., a liquid crystal) is deposited at least on the pixel electrodes which will optically change the active medium's properties in response to the combined voltages or currents produced by the pixels electrodes. The active medium of a given pixel electrode 42 will appear as a square or dot in the overall checkerboard type matrix of the display. The actual size of the FETs and the pixel electrodes 42 are not now drawn to scale, but are shown schematically for the purposes of illustrations. FIG. 1D shows a top view of a plurality of pixel electrodes in a conventional backplane 50.

Figure 2A:
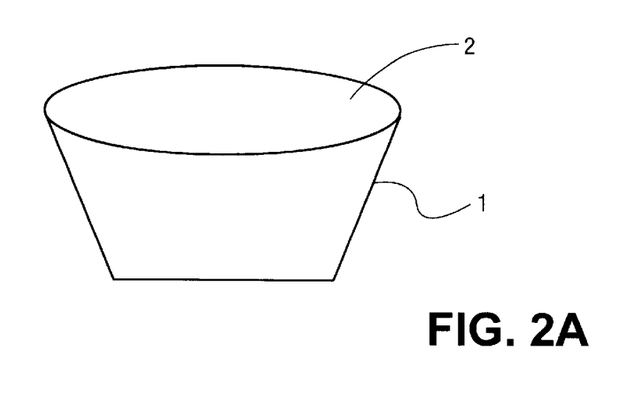
FIG. 2A illustrates an example of a functional component block according to the present invention.
Figure 2B:
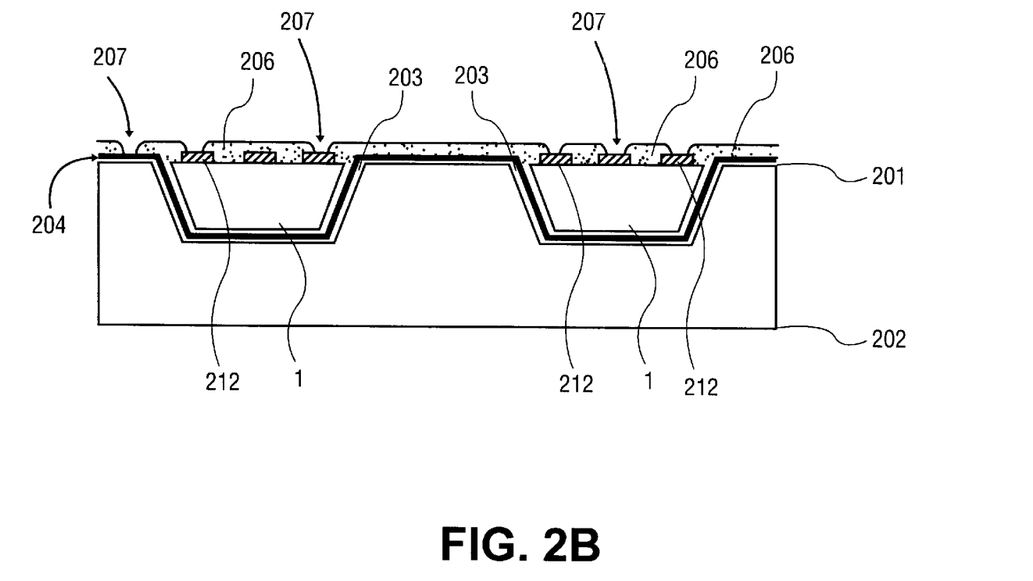
FIG. 2B illustrates an exemplary embodiment of a receiving substrate having the functional components blocks inserted therein.
Figure 2C:
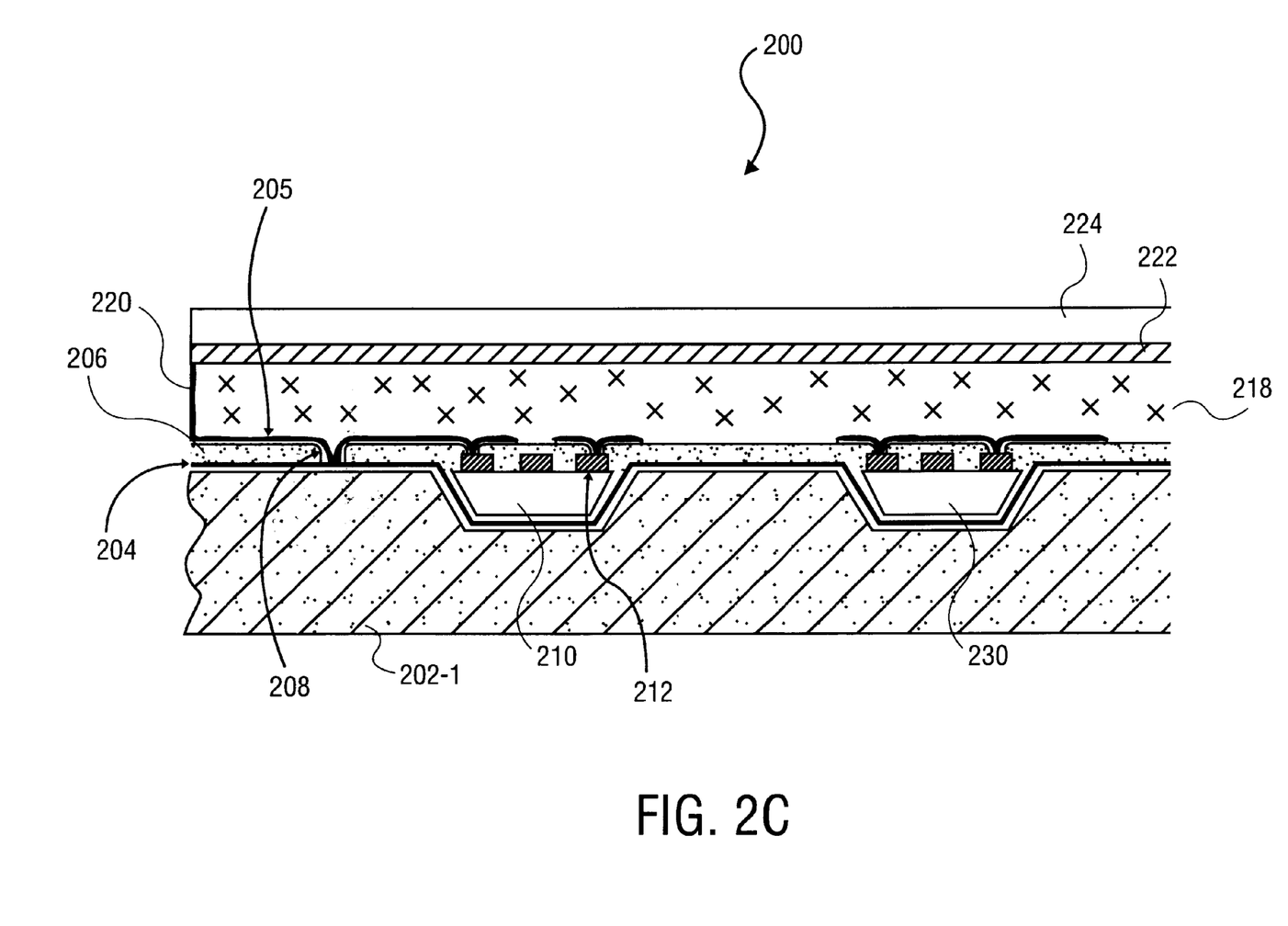
FIG. 2C illustrates an exemplary display with double-metal layer background driving characteristic of the present invention.

FIGS. 2A–2C illustrate exemplary embodiments of displays fabricated according to the present invention. FIG. 2A illustrates an exemplary embodiment of an object that is functional component block 1. Block 1 has a top surface 2 upon which a circuit element is situated (not shown). The circuit element on the top surface 2 may be an ordinary integrated circuit (IC) for any particular function. In this example, the IC may be designed to drive a pixel electrode of a display (e.g., pixel electrode 42). The block 1 has a trapezoidal cross-section where the top of the block is wider than the bottom of the block 1. Block 1 may be created from a host substrate and separated from this substrate. This method of making block 1 can be found in the method described in copending U.S. patent application Ser. No. 09/251,220 now U.S. Pat. No. 6,291,896 which, was filed Feb. 16, 1999 by the inventor John Stephen Smith and which is entitled "Functionally Symmetric Integrated Circuit Die." This application is hereby incorporated herein by reference.

FIG. 2B illustrates an exemplary embodiment in which the blocks 1 is deposited in a recessed region of a receiving substrate 202. One example of a commercially available block 1 is the NanoBlock™ IC. (NanoBlock is a Trademark of Alien Technology Corporation, California). Once deposited, the blocks 1 are recessed within a recess or hole 203 of the receiving substrate 202. Alternatively, once deposited, the blocks 1 are recessed below a surface 201 of the receiving substrate 202. The surface 201 of the receiving substrate 202 is the native surface of the substrate before any deposition of any other materials on top of the surface 201. The receiving substrate 202 may be a flexible substrate made out of plastic, fabric, metal, or some other suitable materials. In this example, the receiving substrate is made out of a flexible polymer material. In one embodiment, the flexible substrate 202 is the backplane 50 of FIG. 1D.

FIG. 2B also shows that in one embodiment, a bottom conductor layer 204 is deposited onto the receiving substrate 202. A conventional deposition method (e.g., blanket deposition) can be used to deposit a bottom conductor layer 204 on top of the receiving substrate 202. The bottom conductor layer 204 must be deposited onto the receiving substrate 202 prior to the FSA process wherein the blocks 1 are deposited in holes or recesses 203 on the receiving substrate 202. The bottom conductor layer 204 may be patterned for any particular purpose. In one example, the bottom conductor layer 204 is simply a smooth layer of conducting materials such as metals, gold, aluminum, silver or the like. In the event that the bottom conductor layer 204 is not patterned, the bottom conductor layer 204 can also function as an shield to prevent interferences from leaking through the receiving substrate 202, which is made out of polymer, and contaminate the blocks 1 therein. The interferences include things such as air, micro-contaminants, micro-particles oxygen, water, light, electrical field coupling, magnetic field coupling, or other unwanted interactions.

In a preferred embodiment, the bottom conductor layer 204 may itself be the bottom pixel electrode for some reflective displays. In this case, the bottom conductor layer 204 is driven by one functional block. The bottom conductor layer 204 then can uniformly drive other segments of the display, for instance, the background portions.

These recessed regions or holes 203 may be created by a variety of methods. For example, the regions or holes 203 may be created by a web wheel, roller, or template, that have protruding structures as described in U.S. patent application Ser. No. 09/270,165 now U.S. Pat. No. 6,281,038, entitled "Apparatuses and Methods for Forming Assemblies" by Jeffrey Jay Jacobsen. This patent application is hereby incorporated by reference. Another method involves using a template having blocks wherein the blocks are pressed into web material making recessed regions or holes 203 into the web material of receiving substrate 202. (See U.S. patent application Ser. No. 09/270,157, entitled "Methods for Transferring Elements From a Template to a Substrate" describing the donor transfer method). This patent application is also hereby incorporated by reference.

The blocks 1 may be deposited into the recessed regions or holes 203 of a receiving substrate 202 by a method described in U.S. Pat. No. 5,545,291. Placing elements, such as pixel drivers, on a substrate is well known. Prior techniques can be generally divided into two types: deterministic methods or random methods. Deterministic methods, such as pick and place, use a human or robot arm to pick each element and place it into its corresponding location in a different substrate. Pick and place methods generally place devices one at a time and are generally not applicable to very small or numerous elements such as those needed for large arrays, such as an active matrix liquid crystal display.

Random placement techniques are more effective and result in high yields if the elements to be placed have the right shape. U.S. Pat. No. 5,545,291 describes a method that uses random placement. In this method, microstructures are assembled onto a different substrate through fluid transport. This is sometimes referred to as fluidic self-assembly (FSA). Using this technique, various blocks, each containing a functional component, (e.g., blocks 1) may be fabricated on one substrate and then separated from that substrate and assembled onto a separate rigid substrate through fluidic self assembly (FSA) process. The blocks which are deposited onto receptor regions of a substrate may include any of a number of different functional components, such as LEDs, pixel drivers, sensors, etc. An example of a particular type of block and its functional component is described in copending U.S. patent application Ser. No. 09/251,220 now U.S. Pat. No. 6,291,896 which was filed Feb. 16, 1999 by the inventor John Stephen Smith and which is entitled "Functionally Symmetric Integrated Circuit Die". This application is hereby incorporated herein by reference. Using FSA in this example, the blocks 1 are thus recessed within the carrier substrate 12 and below the surface 203 of the receiving substrate 202.

FIG. 2B further illustrates that each of the blocks 1 may comprise electrical connection pads such as conducting pads 212. These conducting pads 212 establish the electrical interconnections between the blocks 1 to each other and to other necessary driving circuitry through the use of metal conductors. These conducting pads 212 must be protected from damages that may short out the device when the receiving substrate 202 is assembled together with other components. In one embodiment, an insulation layer 206 is deposited over the entire surface of the receiving substrate 202 such that the insulation layer 206 insulates all the electrical interconnections. For example, conducting pads 212 and other metal conductors on the surfaces 2 of the blocks 1 are insulated with the insulation layer 206. When the receiving substrate comes into contact with another surface, the metal conductors will be protected.

The insulation layer 206 may comprise a plurality of openings, typical called vias 207. The insulation layer 206 is a dielectric material which could comprise a material selected from a group of polyimide, epoxy, photo imageable solder mask or permanent photoresists.

It is through the vias 207 that the functional components in the blocks 1 may establish the necessary electrical interconnections with each other or with any other materials. For example, the vias 207 allows at least one of the blocks 1 to electrically interconnect to the bottom conducting layer 204. The bottom conducting layer 204 can then be interconnected to a plurality of driving circuits which can then be uniformly controlled by the bottom conducting layer 204.

In one embodiment, a top conducting layer 205 (FIG. 2C) is deposited over the insulation layer 206. In essence, the blocks 1 are sandwiched between the top conducting layer 205 and the bottom conducting layer 204. The top conducting layer may be patterned and in which case, the pattern resembles the locations of the vias on the insulation layer 206 where the first level of electrical interconnections occur. The first level of electrical interconnections may include the connections that the blocks 1 may establish with each other. The bottom conducting layer 204 may also be patterned and this pattern may resemble the location of the vias where the second level of electrical interconnection occur. The second level of electrical interconnections may include connections between the bottom conducting layer and the blocks 1.

FIG. 2C illustrates a cross-sectional view of one embodiment of a display system 200 that utilizes the bottom conducting layer 204. In this example, the receiving substrate 202 can be a backplane 202-1 of the display system 200. As shown in FIG. 2C, the backplane 202-1 comprises a plurality of holes or recesses to receive a plurality of functional blocks 210 and 230. Each of the functional blocks is a driving circuit for driving one or several pixel electrodes wherein each pixel electrode controls some image segments or some background segments of the display system 200. For example, the block 210 may be dedicated to drive the background for the display system 200 while the remaining functional blocks, such as the blocks 230, may be dedicated to driving the display's image segments. In such an event other display panel portions comprising other functional blocks that need to drive the background segment made have an electrical interconnections directly established with the backplane 202-1. This eliminates the intricate and complicated interconnection (e.g., interconnections crossing over one another) that is present in conventional displays.

FIG. 2C shows that the bottom conducting layer 204 is deposited on the backplane 202-1 prior to the deposition of the functional blocks. After the functional blocks are recessed within the backplane 202-1, a dielectric insulation layer 206 having a plurality of vias, such as vias 207 or 208, is deposited over the entire surface. The dielectric insulation layer 206 is sometimes referred to as a planarization layer. The vias in the insulation layer 206 may be formed by first having the dielectric material being deposited directly on the backplane 202 (e.g. by a blanket deposition). And then, the insulation layer 206 may be patterned by applying a photoresist over the insulation layer, photodefining openings and then etching the vias 207 or 208 into the insulation layer 206. In a preferred embodiment, the insulation layer 206 itself may be a photodefineable material in which the vias can be directly created. The vias 207 or 208 are formed over the connecting pads (e.g., the connecting pads 212) or over the portions on the bottom conducting layer 204 that will be used to establish the necessary electrical interconnections.

The web material of the backplane 202-1 is then advanced to a further point where the FSA process can be used to deposit the functional blocks such as blocks 210 and 230 into the holes or recesses in the backplane 202-1. Once the functional blocks are recessed within the backplane 202-1 and the insulation layer 206 is also deposited upon the backplane 202-1 and the functional blocks, a conducting material may be deposited thereon. This process is typically referred to as metalization. In the metalization step, an interconnect layer 205, which comprise of conductive polymers, metals (e.g., aluminum, copper, silver, gold, etc.), metal particles, conductive organic compounds, or conductive oxides, are used to complete the necessary electrical interconnections. The interconnect layer 205 may be referred to as a top conducting layer 205. The top conducting layer 205 may be created by various known techniques for applying conductive films and patterning these conductive films onto surfaces or in the vias. The pattern created in these films may be used to determine the electrical interconnections, such as row and column interconnects in an active matrix display.

The top conducting layer 205 may also directly be deposited on top of the insulation layer 206 with a conventional web printing technique. Alternatively, the top conducting layer 205 may be made with the techniques used to create Tape Automated Bonding (TAB) tape interconnections well practiced in the semiconductor industry. In one embodiment, the interconnect 205 is flexible. In such cases, the flexible interconnect layers may be created from one of numerous types of materials which are appropriate for a web tape material which is designed to hold electrically conductive interconnect layers. These materials include polyimide tapes on which are deposited conductive traces of metal. The metal may be deposited directly on the tape (e.g. by a blanket deposition) and then patterned by etching, or a photoresist layer may be applied and patterned, leaving grooves into which metal may be deposited. The interconnect may also be patterned to create an intricate wiring pattern such as row and/or column interconnects for an active matrix display backplane. The actual patterns will depend on the particular application for these functional components or functional blocks.

It will be appreciated that the flexible interconnect layer may also be individually fabricated in a web process and then aligned with the web material of backplane 202-1 having the functional blocks either in a web process or outside of a web process. It will be further appreciated that the backplane 202-1 may be flexible, planar, or rigid and made in a web process or batch process. It will also be appreciated that an alignment operation, using conventional techniques, may be necessary to properly align the interconnect layer 205 relative to the backplane 202-1 having the functional blocks and the insulation layer 206 when the interconnect layer 205 is coupled to the backplane 202-1.

In one embodiment, the process of interconnecting the functional components embedded in the backplane 202-1 uses only a single layer of metalization for the interconnect layer 205. This will reduce the possibility of interlayer shorts on the electronic devices.

In a preferred embodiment, the top conducting layer 205 also includes the transparent pixel electrodes that drive the display segments. Each of the functional blocks drives at least one transparent pixel electrode. In this case, the top conducting layer 205 may also be patterned and the pattern may indicate the interconnecting points that the pixel electrodes establish with the functional blocks. FIG. 2C also illustrates that the top conducting layer 205 establishes the electrical interconnection between the block 210 to the bottom conducting layer 204 through the via 208. The bottom conducting layer 204 then will be establishing any necessary interconnection with other segments of the display system 200 that can be uniformly controlled, for example, the background. In this sense, one functional block and double-metal layers, the bottom conducting and the top conducting layers, control the background of the display 200. Thus, the functional block is sandwiched between two metalization layer.

The top conducting layer 205 may include other electrical interconnects, which is also transparent, such as the row and column lines in an active matrix display backplane. For example, the layer 205 may include row interconnects, each row interconnect for coupling to a gate electrode of a transistor in the functional blocks through the vias. The top conducting layer 205 may include column interconnects, each column interconnect for coupling to an electrode (e.g., source electrode) of a transistor in the functional blocks through interconnect vias.

Note that any electrical interconnection between the functional blocks and the bottom conducting layer 204 is established with the top conducting pads 212 on the top surfaces 2 of the functional blocks. In that sense, the bottoms of the functional blocks establish no direct electrical interconnection with the backplane 202-1. The interconnection is established from the conducting pad 212 to the conducting layer 205, through the via 208 and down to the bottom conducting layer 204. This concept gives rise to the unique double-metal background driven characteristic of the display 200. In this sense, the functional blocks can be seen as sealed or sandwiched between two conducting layer. One advantage of the present embodiment is that any contamination that may leak through the backplane 202-1. When the backplane 202-1 is made out of a flexible material such as polymer, interferences may leak through the backplane 202-1. The bottom conducting layer 204 will function to prevent contamination resulting in a better and cleaner display system 200 that has a flexible backplane.

FIG. 2C also illustrates that a display insulation layer 206 may be deposited on top of the bottom conducting layer 204 to insulate the bottom conducting layer 204 from the display material 218. The display material 218 may be a nematic liquid crystal, an electrophoretic display material, a polymer dispersed liquid crystal (PDLC) material, an organic light emitting diode material, a cholesteric liquid crystal material, an electrochromic material, a particle-based material, a thin-film electroluminescent material, or other known display materials which can be driven by pixel electrodes or other types of display materials which may be controlled by electrodes. In a preferred material, the display material is made out of PDLC. And in that event, the PDLC is deposited directly on the top conducting layer 205.

A counter electrode or cover glass electrode 222 may then be deposited on over the display material. The counter electrode 222, typically a thin layer of transparent indium tin oxide (ITO), is deposited upon a cover glass 224, which is also transparent. The cover glass 224 can also be made out of any other suitable material, for instance, plastic. In the case of a liquid crystal filled display material, spacers 220 are disposed between the top conducting layer 205 and to the cover glass 224 to provide a desired spacing between the ITO 222 and the top conducting layer 205.

As well known in the art, one of the largest cost elements in a standard LCD is the external driver circuitry. A typical LCD requires a large number of external connections from the glass panel, because each pixel has its own connection to the driver circuitry. This requires discrete logic chips arranged on the printed circuit boards (PCBs) around the periphery of the display, thus, limiting the size of the surrounding casing. Display drivers have been made an integral part of the display. However, there are segments of the display dedicated to control the images and other segments dedicated to control the background. As discussed above, one way to control the background is to have a voltage applied to particular segments which in turn realigns the particular liquid crystals so that light cannot pass through thereby producing dark pixels. To make a dark background voltages must be individually and simultaneously applied to the multiple functional blocks that drive the multiple segments of the display that control the background. And, each pixel requires its own connection to the functional blocks that have the driver circuitry for the background segments. These interconnections are multiple and complex at the minimum. The numerous necessary electrical interconnection is intricate and complicated, thus, making the fabrication of the display expensive.

The present invention offers a major cost saving toward this complex electrical interconnections problem. With the bottom conducting layer 204, the pixel electrodes that are dedicated to driving the background may establish direct electrical interconnections with the backplane, which will supply the electrical interconnection to these segments. As mentioned, the electrical interconnections are established through the vias such as vias 207 and 208 thus minimizing the complicated metalization necessary to drive the background. For instance, the pixel electrodes that need to connect to the functional block that has the circuitry to make the pixels dark may connect directly to the bottom conducting layer through vias. These connectors are shorter, simpler, and much less complicated. The present invention also minimize the number of the functional blocks needed to drive the background of the display. For instance, one functional block such as block 210 would drive the backplane 202 and the backplane 202 would make the interconnection to the multiple pixels that are the background driven pixels. When all of the background driven pixels are interconnected to the block 210, these pixels would then be driven together at the same time. There are many instances where all of these segments that control the background should be uniformly controlled. Thus, having multiple display drivers for these background segments is wasteful not to mention making the fabrication of the display unnecessarily complicated.

Figure 3:
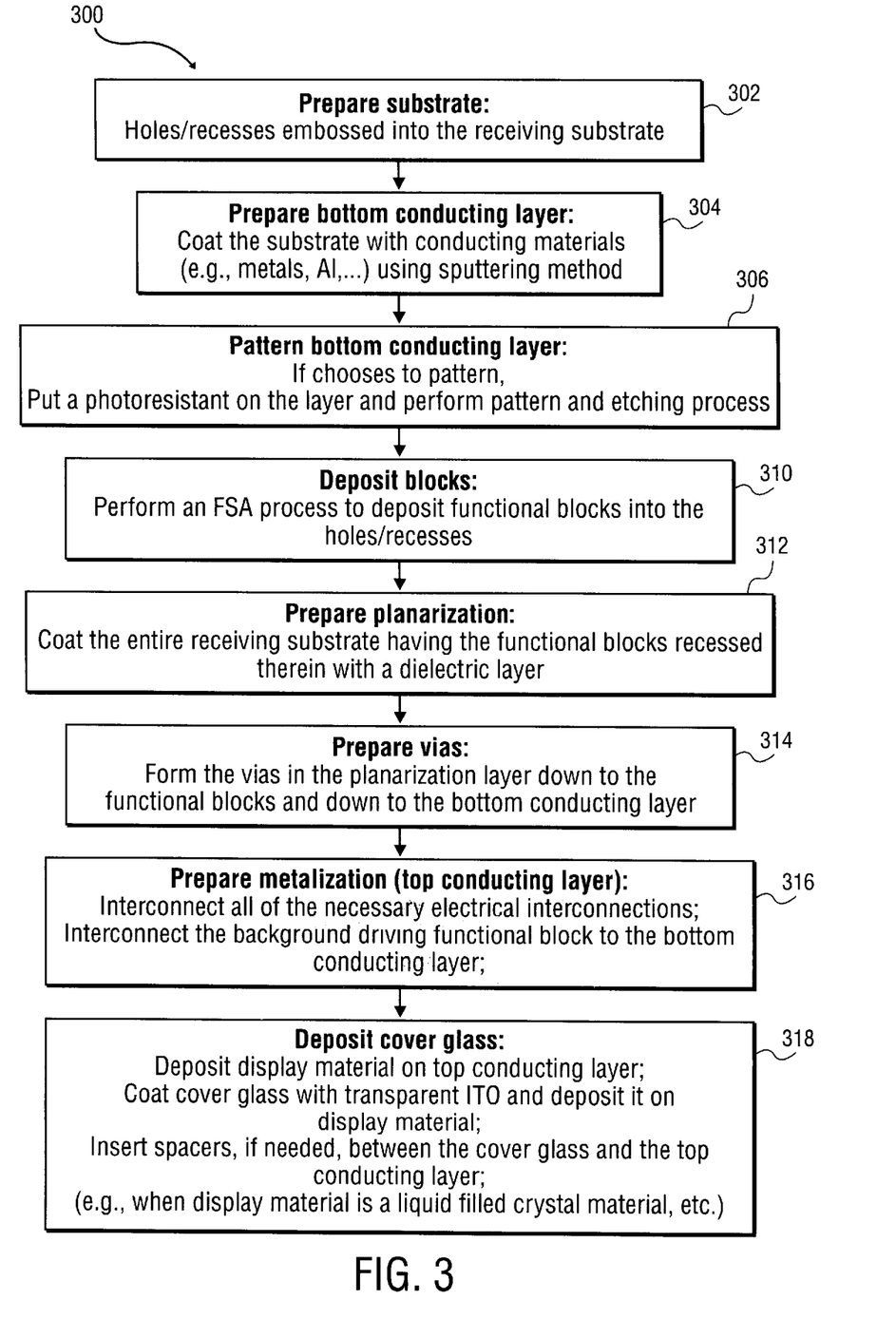
FIG. 3 illustrate an exemplary process flow diagram for fabricating embodiments of the present invention.

FIG. 3 illustrate an exemplary process 300 of fabricating a display according to the present invention. In step 302 we prepare a receiving substrate to accept the functional blocks 1 that are the display drivers. The receiving substrate is flexible and forms the backplane of the display. The flexible displays may be either an active matrix or a passive matrix displays. Holes and recesses are embossed into the receiving substrate. In one example, the receiving substrate is a polymer material to give the backplane its flexible property.

Step 304 illustrates that we next coat the receiving substrate with a conducting material to form the bottom conducting layer. This bottom conducting layer will drive the background segments of the display. A sputtering machine can be used to deposit a layer of the conducting material onto the receiving substrate to form the bottom conducting layer. In one example, the bottom conducting layer is about 0.5 $\mu$m thick. In step 306 we may choose to create some patterns into the bottom conducting layer for any particular purpose. A photoresistant may be deposited on the bottom conducting layer and an etchant material can be used to create the pattern. In one example the bottom conducting layer is smooth and contain no patterns. As mentioned above this is useful as a shield that will block interferences to the functional blocks. hi another example, the bottom conducting layer can function as a reflector in the case of a reflective type of a display.

In step 308 we use the FSA process reference above to deposit functional blocks comprising driving circuits into the holes or recesses in the receiving substrate, which may be flexible. In the FSA process, a slurry (e.g., water solution with some minor additives such as ethanol or some suitable solvent) is used to enable the functional blocks to flow over the receiving substrate. The blocks are contained in slurry and are then flowned and ultimately deposited onto a flexible receiving substrate. Although the blocks may be comprised of single crystal silicon or other like material which makes the block rigid, a flexible substrate may still be flexible because of the size of these blocks (100×100 microns or 350×350 microns, or up to 600×600 microns) is still small in comparison to the flexible substrate. Flow or vibration may be applied to help direct these functional blocks to the holes or recesses. The slurry may be passed over the receiving substrate more than one time if necessary to get all of the holes and recesses filled with the functional blocks. In one example, once deposited, these functional blocks will be recessed below a native surface of the receiving substrate.

In step 310 we planarize the receiving substrate that now includes all of the necessary functional components. Planarization functions to insulate the conducting pads and the bottom conducting layer. In planarization, a dielectric material is deposited over the entire receiving substrate. This dielectric material also includes a plurality of vias. The vias may be formed by first having the dielectric material being deposited directly on the receiving substrate by a blanket deposition. Then, the planarization layer may be patterned by applying a photoresist over the planarization layer, photodefining the openings for the vias and then etching the vias into the insulation layer. Alternatively, the insulation layer 206 may be a photodefineable material in which the vias can be directly created. The vias are formed over the connecting pads (e.g., connecting pads 212) or over the portions on the bottom conducting layer that will be used to establish the necessary electrical interconnections.

In step 314 we establish the necessary electrical interconnection, either between one functional block to another or between one functional block to the bottom conducting layer. This is typically referred to as metalization. The electrical interconnection can be established with a layer of conducting material which can be referred to as the top conducting layer. In one example, the top conducting layer may be deposited over the planarization layer (e.g., through blanket deposition) and it is through the vias that the top conducting layer will establish the necessary electrical interconnections with the functional blocks or the bottom conducting layer. Among the typical methods of metalization are methods using inkjet, lithography and etch, screen print, laser etch, or deposit technologies. The electrical interconnection layer can generally be comprised of aluminum, copper, gold, conductive organic compounds, other metallic material, or in the case of transparent interconnects or electrodes, indium tin oxide may be used. The metalization layer also includes a transparent layer of pixel electrodes. Next, the functional blocks, after deposited onto the substrate and electrically interconnected as needed, are coupled to pixel electrodes and to row and column interconnects in order to create an active matrix backplane which, includes an array of pixel electrodes. Transparent interconnects may be utilized. Pixel electrodes are typically transparent and so are the interconnects for coupling each pixel electrode to its respective interconnect on its respective functional block. Pixel electrodes may be interconnected directly to the appropriate functional block for driving the pixels on the screen. Pixel electrodes may also be interconnected to the bottom conducting layer in the backplane to drive the background of the screen. The necessary interconnects may go through vias.

Finally, the cover glass, the ITO layer and the display materials can be assembled in steps 316 as illustrated in the FIG. 3. The display material may be sprayed onto the backplane layer. The display material also may be placed on a screen over the backplane layer. Another method is to place the backplane layer into a container that holds the display material. The backplane layer then has the display material layered or patterned on the backplane layer.

The description in this application, for purposes of illustration, focuses upon the use of these integrated circuits for display devices. It will be appreciated, however, that these integrated circuits may be used in other types of systems including antenna arrays or detector systems, sensor systems, solar reflector system, or to provide multiple functions concurrently such as a display and touch screen system where each integrated circuit functions as a display driver as well as providing the circuitry necessary for the functionality of a touch screen sensor. It will also be appreciated that when the integrated circuits of the present invention are used in display devices, for example, as display drivers, that various different types of displays may be created. For example, the display may be a reflective monochrome or color active matrix display, or it may be a transmissive active matrix display such as those found on modem laptop computers (e.g., such as the Macintosh PowerBooks G3 laptop from Apple Computer), or it may be an emissive display device (e.g., such as an OLED display). The display may require refreshing or may be bistable (which retains its display state without refreshing).

Additionally, the present invention may also be incorporated into making an optical reflector, an imaging device (e.g., camera), or a solar reflector device. In these examples, the functional blocks 1 are fabricated small enough such that they are essentially transparent allowing light to travel through. When the receiving substrate is also transparent, and if the bottom conducting layer is not present in the embodiment, light would be escaping and scattering off the receiving substrate.

In the embodiments discussed above, however, because of the bottom conductor layer 204, the light will pass through the blocks 1 and then will reflect off the receiving substrate and bounce into the block 1 again. The light is forced to pass back and forth through the device more than once. This increases the amount of light that the blocks 1 will be retained. Alternatively, the blocks 1 may be pulled to one side of the holes or recesses. The blocks 1 are smaller than the holes. Being a metal, the bottom conductor layer can be used to cause light to reflect into the blocks 1. Thus, greater reflectance is achieved with the same amount of light when the bottom conductor layer 204 is utilized. These blocks 1 can be used in an imager device, a solar collector, a camera type detector, or a light emitting device in which these blocks 1 will help increase the efficiency of these types of devices.

We claim:

1. An electronic assembly comprising:

at least one object created and separated from a host substrate, said at least one object having a first electrical circuitry therein;

a flexible receiving substrate having at least one recess, said flexible receiving substrate including said at least one recess being covered with a bottom conducting layer;

wherein said at least one object couples to said flexible receiving substrate such that said at least one object is deposited on said bottom conducting layer and is recessed within said at least one recess of said receiving substrate; and a top conducting layer to facilitate electrical interconnections from said at least one object to said bottom conducting layer is coupled to said flexible receiving substrate.

2. An electronic assembly as in claim 1 further comprising an insulation layer disposing over said receiving substrate and said at least one object such that said insulation layer insulating said bottom conducting layer and said at least one object, said insulation layer including a plurality of vias through which said electrical interconnections occur.

3. An electronic assembly as in claim 2 wherein said at least one object is deposited below a surface of said flexible receiving substrate.

4. An electronic assembly as in claim 3 wherein said bottom conducting layer is patterned layer.

5. An electronic assembly as in claim 4 wherein said bottom conducting layer drives a backplane of a display.

6. An electronic assembly as in claim 5 wherein said at least one object is an integrated circuit.

7. An electronic assembly as in claim 6 wherein said bottom conducting layer is a reflective material.

8. An electronic assembly as in claim 7 wherein said bottom conducting layer makes said electrical interconnections through said vias to said at least one object such that said electrical interconnections are only made to a top side of said at least one object.

9. An electronic assembly as in claim 8 wherein said flexible receiving substrate is nonconductive.

10. An electronic assembly comprising:
at least one object created and separated from a host substrate, said at least one object having a first electrical circuitry therein;
a flexible receiving substrate having at least one recess, said flexible receiving substrate including said at least one recess being covered with a bottom conducting layer;
wherein said at least one object couples to said flexible receiving substrate such that said at least one object being deposited on said bottom conducting layer and is recessed within said at least one recess of said flexible receiving substrate; and
a top conducting layer to facilitate electrical interconnections from said at least one object is coupled to said flexible receiving substrate;
wherein said bottom conducting layer is an optical reflector.

11. An electronic assembly as in 10 wherein said bottom conducting layer is a solar cell reflector.

12. An electronic assembly as in 11 wherein said bottom conducting layer is made out of aluminum.

13. A display device comprising:
an array of display drivers to drive pixel electrodes, each of said display drivers includes an electrical circuitry therein and is created and separated from a host substrate;
a receiving substrate having an array of recesses, said receiving substrate including said recesses is covered with a bottom conducting layer;
wherein each of said display drivers is coupled to said receiving substrate such that said display drivers are deposited on said bottom conducting layer and recessed within said each of said recesses;
an insulation layer disposing over said receiving substrate such that said insulation layer insulates said bottom conducting layer and said display drivers; and
a top conducting layer to facilitate electrical interconnections between said display drivers and said pixel electrodes is coupled to said receiving substrate.

14. A display device as in claim 13 wherein said array of display drivers controls said display device.

15. A display device as in claim 14 wherein said receiving substrate is flexible.

16. A display device as in claim 15 wherein said receiving substrate is a backplane of said display device.

17. A display device as in claim 16 wherein said array of display drivers is further deposited below a surface of said receiving substrate.

18. A display device as in claim 17 wherein said insulation layer further comprises a plurality of vias wherethrough said electrical interconnections occur.

19. A display device as in claim 18 wherein said display drivers interconnect to said bottom conducting layer through said electrical interconnections.

20. An electronic assembly comprising:
at least one object created and separated from a host substrate, said at least one object having a first electrical circuitry therein;
a receiving substrate having at least one recess, said receiving substrate including said at least one recess being covered with a bottom conducting layer;
wherein said at least one object is coupling to said receiving substrate such that said at least one object is deposited on said bottom conducting layer and recessed within said at least one recess of said receiving substrate; and
a top conducting layer to facilitate electrical interconnections from said at least one object to said bottom conducting layer is coupled to said receiving substrate;
wherein said bottom conducting layer is a non-patterned layer such that said bottom conducting layer being a shield that blocks interference to said at least one object.

21. An electronic assembly as in claim 20 wherein said interference comprises at least one of light, contaminants, electrical field coupling, magnetic field coupling, and unwanted interactions.

22. An electronic assembly comprising:
at least one object created and separated from a host substrate, said at least one object having a first electrical circuitry therein;
a receiving substrate having at least one recess, said receiving substrate including said at least one recess being covered with a patterned bottom conducting layer is coupled to said at least one object such that said at least one object is deposited on said patterned bottom conducting layer and recessed within said at least one recess of said receiving substrate; and
a patterned top conducting layer disposed over said receiving substrate such that said patterned top conducting layer and said patterned bottom conducting layer sandwich said at least one object therebetween,
wherein said patterned top conducting layer facilitates a first level of electrical interconnections and wherein said patterned bottom conducting layer facilitates a second level of electrical interconnections.

23. An electronic assembly as in claim 22 wherein said first level of electrical interconnections comprises a first set of interconnections between said at least one object to other objects having electrical circuitries therein, said other objects are created and separated from said host substrate, and coupled to said receiving substrate.

24. An electronic assembly as in claim 22 wherein said second level of electrical interconnections comprises a second set of interconnections between said at least one object to said patterned bottom conducting layer.

25. A method of making an electronic assembly comprising:
  creating and separating at least one object from a host substrate, said at least one object having a first electrical circuitry therein;
  coupling a bottom conducting layer to a flexible receiving substrate having at least one recess such that said flexible receiving substrate including said at least one recess is coated with said bottom conducting layer;
  coupling said at least one object to said receiving substrate such that said at least one object is deposited on said bottom conducting layer and is recessed within said at least one recess of said receiving substrate; and
  coupling a top conducting layer to flexible substrate, said top conducting layer to facilitate electrical interconnections from said at least one object to said bottom conducting layer.

26. A method of making an electronic assembly as in claim 25 further comprising:
  deposing an insulation layer over said receiving substrate and said at least one object such that said insulation layer insulating said bottom conducting layer and said at least one object, said insulation layer including a plurality of vias through which said electrical interconnections occur.

27. A method of making an electronic assembly as in claim 26 wherein said coupling of said at least one object to said receiving substrate is such that said at least one object is deposited below a surface of said flexible receiving substrate.

28. A method of making an electronic assembly as in claim 27 further comprising:
  configuring said conducting layer such that said conducting layer is a patterned layer.

29. A method of making an electronic assembly as in claim 28 further comprising:
  configuring said conducting layer drives to be a backplane of a display.

30. A method of making an electronic assembly as in claim 29 further comprising:
  configuring said at least one object to be an integrated circuit.

31. A method of making an electronic assembly as in claim 30 further comprising:
  configuring said bottom conducting layer to be a reflective material.

32. A method of making an electronic assembly as in claim 31 wherein said bottom conducting layer makes said electrical interconnections through said vias to said at least one object such that said electrical interconnections are only made to a top side of said at least one object.

33. A method of making an electronic assembly as in claim 32 further comprising:
  configuring said flexible receiving substrate to be non-conductive.

34. A method of making an electronic assembly comprising:
  creating and separating at least one object from a host substrate, said at least one object having a first electrical circuitry therein;
  coupling a with a bottom conducting layer to a flexible receiving substrate having at least one recess such that said flexible receiving substrate including said at least one recess is coated with said bottom conducting layer;
  coupling said at least one object to said flexible receiving substrate such that said at least one object is deposited on said bottom conducting layer and is recessed within said at least one recess of said flexible receiving substrate; and
  coupling a top conducting layer to said flexible receiving substrate such that said top conducting facilitates electrical interconnections from said at least one object;
  wherein said bottom conducting layer is an optical reflector.

35. A method of making an electronic assembly as in claim 34 further comprising:
  configuring said bottom conducting layer to be a solar cell reflector.

36. A method of making an electronic assembly as in claim 35 further comprising:
  choosing an aluminum material for said bottom conducting layer.

37. A method of making a display device comprising:
  creating and separating an array of display drivers from a host substrate to drive pixel electrodes, each of said display drivers includes an electrical circuitry therein;
  coupling a bottom conducting layer to a receiving substrate having an array of recesses;
  coupling each of said display drivers to said receiving substrate such that said display drivers are deposited on said bottom conducting layer and recessed within said recesses;
  coating an insulation layer over said receiving substrate such that said insulation layer insulates said bottom conducting layer and said display drivers;
  coupling a top conducting layer to said receiving substrate, said top conducting layer facilitates electrical interconnections between said display drivers and said pixel electrodes.

38. A method of making a display device as in claim 37 further comprising:
  configuring said array of display drivers to control said display device.

39. A method of making a display device as in claim 38 further comprising:
  configuring said receiving substrate to be flexible.

40. A method of making a display device as in claim 39 further comprising:
  configuring said receiving substrate to be a backplane of said display device.

41. A method of making a display device as in claim 40 further comprising:
  depositing said array of display drivers below a surface of said receiving substrate.

42. A method of making a display device as in claim 41 further comprising:
  configuring said insulation layer further to include a plurality of vias wherethrough said electrical interconnections occur.

43. A method of making a display device as in claim 42 further comprising:
  interconnecting said display drivers to said bottom conducting layer through said electrical interconnections.

44. A method of making an electronic assembly comprising:
  creating and separating at least one object from a host substrate, said at least one object having a first electrical circuitry therein;
  coupling a bottom conducting layer to a receiving substrate having at least one recess such that said receiving substrate including said at least one recess is covered with said bottom conducting layer;

coupling said at least one object to said receiving substrate such that said at least one object is deposited on said bottom conducting layer and recessed within said at least one recess of said receiving substrate; and coupling a top conducting layer to said at least one object such that said top conducting layer facilitate electrical interconnections from said at least one object to said bottom conducting layer;

wherein said bottom conducting layer is a non-patterned layer such that said bottom conducting layer acts as a shield that blocks interference to said at least one object.

45. A method of making an electronic assembly as in claim 44 wherein said interference comprises at least one of light, contaminants, electrical field coupling, magnetic field coupling, and unwanted interactions.

46. A method of making an electronic assembly comprising:

creating and separating at least one object from a host substrate, said at least one object having a first electrical circuitry therein;

coupling a with a patterned bottom conducting layer to a receiving substrate having at least one recess such that said receiving substrate including said at least one recess is coated with said patterned bottom conducting layer;

coupling said at least one object to said receiving substrate such that said at least one object is deposited on said patterned bottom conducting layer and is recessed within said at least one recess of said receiving substrate; and coupling a patterned top conducting layer to said receiving substrate such that said patterned top conducting layer and said patterned bottom conducting layer sandwich said at least one object therebetween;

wherein said patterned top conducting layer facilitates a first level of electrical interconnections and said patterned bottom conducting layer facilitates a second level of electrical interconnections.

47. A method of making an electronic assembly as in claim 46 wherein said first level of electrical interconnections comprises a first set of interconnections between said at least one object to other objects having electrical circuitries therein, said other objects are created and separated from said host substrate, and coupled to said receiving substrate.

48. A method of making an electronic assembly as in claim 47 wherein said second level of electrical interconnections comprises a second set of interconnections between said at least one object to said patterned bottom conducting layer.

49. An electronic assembly comprising:

at least one object created and separated from a host substrate, said at least one object having a first electrical circuitry therein;

a receiving substrate having at least one recess, said receiving substrate including said at least one recess being covered with a bottom conducting layer;

wherein said at least one object couples to said receiving substrate such that said at least one object is deposited on said bottom conducting layer and is recessed within said at least one recess of said receiving substrate; and a top conducting layer coupled to at least one of said one object and said bottom conducting layer.

50. An electronic assembly as in claim 49 further comprising an insulation layer disposing over said receiving substrate and said at least one object such that said insulation layer insulating said bottom conducting layer and said at least one object, said insulation layer including a plurality of vias through which electrical interconnections occur.

* * * * *

UNITED STATES PATENT AND TRADEMARK OFFICE
CERTIFICATE OF CORRECTION

PATENT NO.    : 6,590,346 B1                                      Page 1 of 1
DATED         : July 8, 2003
INVENTOR(S)   : Mark Alfred Hadely et al.

It is certified that error appears in the above-identified patent and that said Letters Patent is hereby corrected as shown below:

Column 1,
Line 3, please insert -- This invention was made with government support under Contract No. DAAD16-00-C-9234. The government has certain rights to this invention. --.

Signed and Sealed this

Thirtieth Day of August, 2005

JON W. DUDAS
*Director of the United States Patent and Trademark Office*